US012328826B2

United States Patent
Bradley et al.

(10) Patent No.: US 12,328,826 B2
(45) Date of Patent: Jun. 10, 2025

(54) SOLDER PADS WITH CONCAVE EDGES FOR BALL GRID ARRAYS

(71) Applicant: MOTOROLA SOLUTIONS, INC., Chicago, IL (US)

(72) Inventors: Edwin L Bradley, Chicago, IL (US); Anthony J Suppelsa, Chicago, IL (US); David J Meyer, Chicago, IL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 559 days.

(21) Appl. No.: 17/571,092

(22) Filed: Jan. 7, 2022

(65) Prior Publication Data

US 2023/0225060 A1 Jul. 13, 2023

(51) Int. Cl.
*H05K 3/34* (2006.01)
*H01L 23/00* (2006.01)
*H01L 23/31* (2006.01)
*H01L 23/498* (2006.01)
*H05K 1/11* (2006.01)

(52) U.S. Cl.
CPC ....... *H05K 3/3436* (2013.01); *H01L 23/3128* (2013.01); *H01L 23/49816* (2013.01); *H01L 24/16* (2013.01); *H05K 1/111* (2013.01); *H01L 2924/15311* (2013.01); *H05K 2201/10734* (2013.01)

(58) Field of Classification Search
CPC .............. H01L 23/3128; H05K 3/3436; H05K 2201/10734
See application file for complete search history.

(56) References Cited

U.S. PATENT DOCUMENTS

| | | | | |
|---|---|---|---|---|
| 5,875,102 | A * | 2/1999 | Barrow | H01L 23/49816 174/265 |
| 7,098,408 | B1 * | 8/2006 | Camerlo | H05K 1/111 361/777 |
| 10,729,050 | B2 * | 7/2020 | Cyril | H05K 3/4038 |
| 2004/0226742 | A1 * | 11/2004 | Wyrzykowska | H05K 3/303 174/267 |
| 2006/0131758 | A1 | 6/2006 | Dao | |
| 2008/0093749 | A1 * | 4/2008 | Gerber | H01L 23/49816 257/784 |
| 2009/0242261 | A1 * | 10/2009 | Takenaka | H05K 1/0271 174/262 |

\* cited by examiner

*Primary Examiner* — Walter H Swanson
*Assistant Examiner* — Jacob T Nelson
(74) *Attorney, Agent, or Firm* — PERRY + CURRIER INC.

(57) ABSTRACT

A device is provided that includes: a substrate including dielectric material and a conductive via extending into the substrate from a surface of the substrate. The device further includes a conductive pad positioned at the surface of the substrate and offset in a plane of the surface from the conductive via, the conductive pad to receive a solder joint connection to an electronic component. The conductive pad includes a concave edge that defines a gap with a convex edge of the conductive via.

20 Claims, 8 Drawing Sheets

SOLDER PADS WITH CONCAVE EDGES FOR BALL GRID ARRAYS

BACKGROUND

Solder connections are used to electrically, and often also mechanically, connect circuit components. A ball grid array (BGA), for example, may be used as surface-mount packaging to connect an integrated circuit (IC) to a circuit board. A BGA may provide a large number of discrete solder connections between the IC and the circuit board. The circuit board may include a number of layers with conductive traces and vias to connect to the discrete solder connections of the BGA.

BRIEF DESCRIPTION OF THE SEVERAL VIEWS OF THE DRAWINGS

In the accompanying figures similar or the same reference numerals may be repeated to indicate corresponding or analogous elements. These figures, together with the detailed description, below are incorporated in and form part of the specification and serve to further illustrate various embodiments of concepts that include the claimed invention, and to explain various principles and advantages of those embodiments.

Figure 1A:
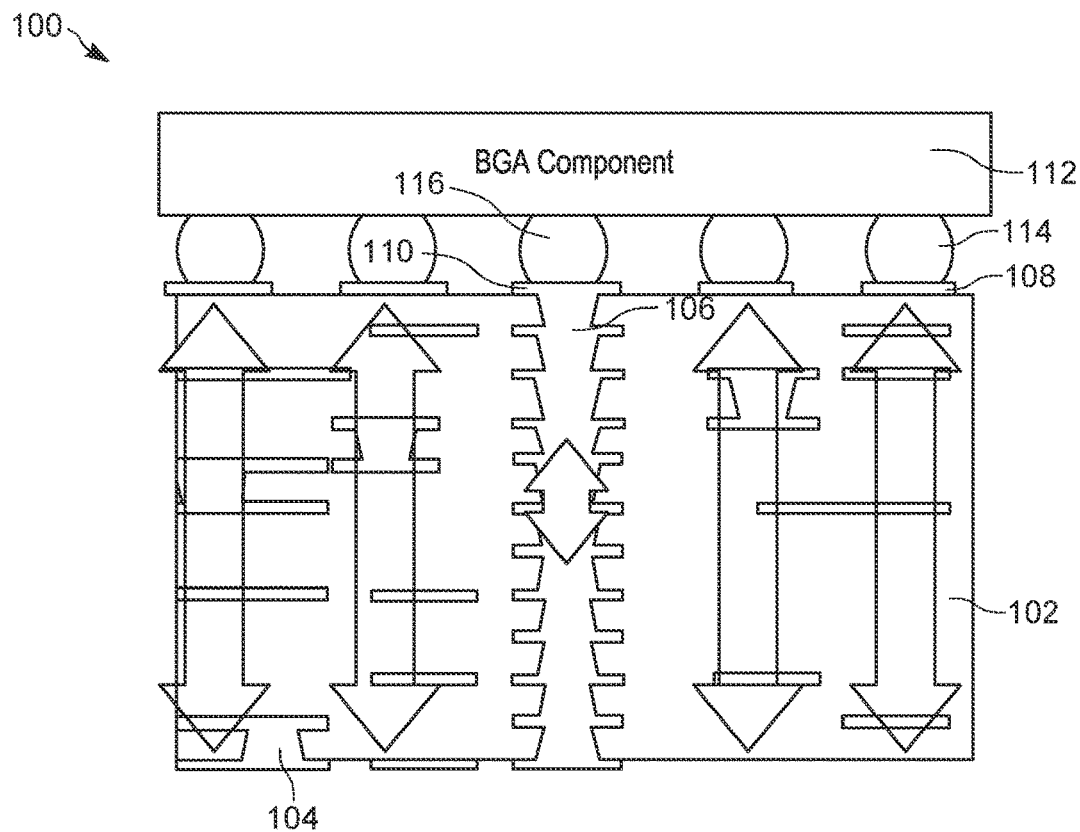
FIG. 1A is a cross-sectional view of a device with a substrate, vias, and contact pads to surface mount a BGA.

The illustrated components have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

DETAILED DESCRIPTION OF THE INVENTION

The present disclosure teaches techniques to reduce or eliminate a type of cracking or fracturing failure of BGA connections. The inventors of the present disclosure discovered solutions to a mode of failure not widely known and herein provide such solutions to reduce or eliminate the risk of this mode of failure occurring.

Differential thermal expansion between circuit board dielectric material and conductive vias was found to crack or fracture BGA connections. This problem is particularly pronounced with stacked vias because a stacked via provides a relatively long continuous length of metal within a surrounding dielectric material, and thereby provides a greater length over which differential thermal expansion may act. The present disclosure provides solutions to this problem.

In accordance with an example embodiment, a device includes a substrate including dielectric material, a conductive via extending into the substrate from a surface of the substrate, and a conductive pad positioned at the surface of the substrate and offset in a plane of the surface from the conductive via. The conductive pad is to receive a solder joint connection to an electronic component. The conductive pad includes a concave edge that defines a gap with a convex edge of the conductive via.

In accordance with another example embodiment, a device includes a multilayer circuit board, a plurality of solder pads positioned at a surface of the multilayer circuit board to receive solder joint connections to an electronic component, a stacked via in the multilayer circuit board and exiting the multilayer circuit board at the surface at a position adjacent at least two solder pads of the plurality of solder pads, and a trace connection at the surface of the multilayer circuit board connecting the stacked via to a first solder pad of the at least two solder pads. A second solder pad of the at least two solder pads includes a concave edge that provides a gap with respect to a convex edge of the stacked via.

In accordance with another example embodiment, a device includes a substrate, an array of solder pads on a surface of the substrate to receive a ball grid array of an electronic component to be mounted to the substrate, and an array of candidate via locations arranged interstitially among to the array of solder pads. Each candidate via location of the array of candidate via locations includes a boundary to space a via disposed at the candidate via location apart from any solder pads of the array of solder pads adjacent the candidate via location. A solder pad of the array of solder pads includes a concave shape to accommodate the boundary of any adjacent candidate via location.

Further advantages and features consistent with this disclosure will be set forth in the following detailed description, with reference to the figures.

FIG. 1A shows a device 100 with a substrate 102, conductive vias 104, 106, and conductive pads 108, 110 to surface mount a BGA component 112. The pads 108, 110, which may be termed solder pads, are aligned with solder joints 114, 116 of the BGA component 112 to receive the electrical and mechanical connection of the BGA component 112. Any of the vias, such as the via 106, may be a stacked via that provides a relatively large amount of conductive material in direct alignment with a solder joint 116.

Figure 1B:
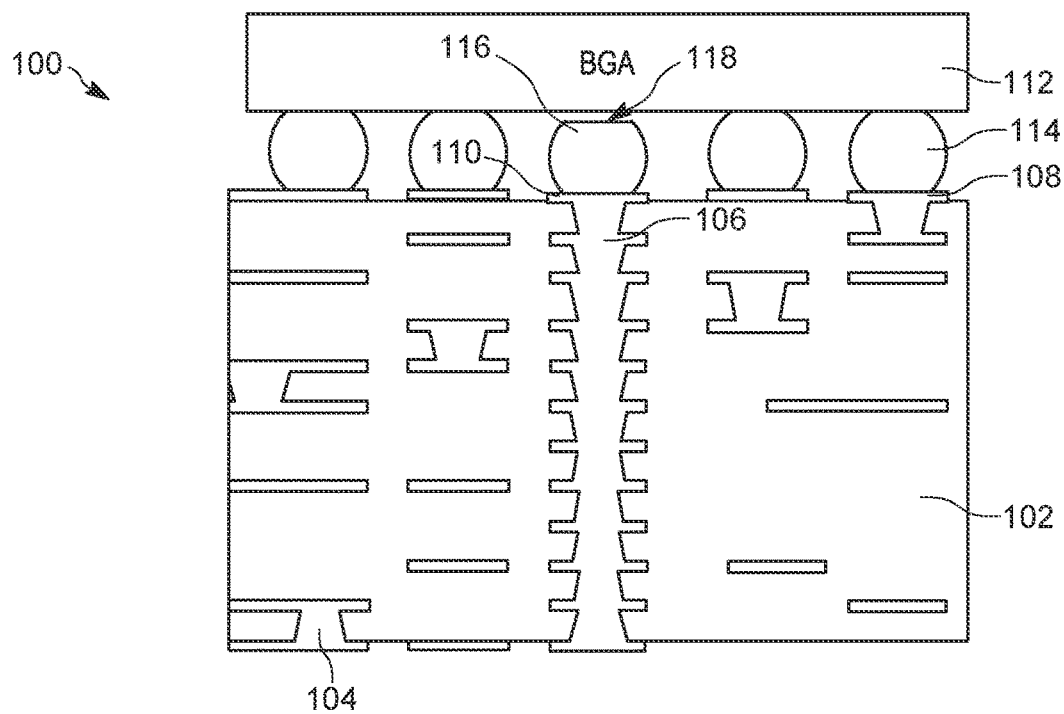
FIG. 1B is a cross-sectional view of the device of FIG. 1A experiencing failure due to heating.

The device 100 may be heated, such as during reflow assembly and rework. It was discovered that, when heated, the substrate 102 may undergo a greater amount of thermal expansion than the conductive material that forms the vias due to the difference in material properties, as may be quantified by the coefficient of thermal expansion. Different amounts of thermal expansion at different regions of the device 100 are shown by the arrows in FIG. 1A. Differential thermal expansion was found to be particularly significant at stacked vias, such as the via 106. A stacked via 106 may expand much less than the surrounding substrate 102 material. In effect, as depicted in FIG. 1B, thermal expansion of the substrate 102 may push the BGA component 112 away from certain solder joints, such as the solder joint 116, which may result in cracking or fracturing of the solder joint 116, shown at 118, and failure or malfunction of the device 100.

Figure 2A:
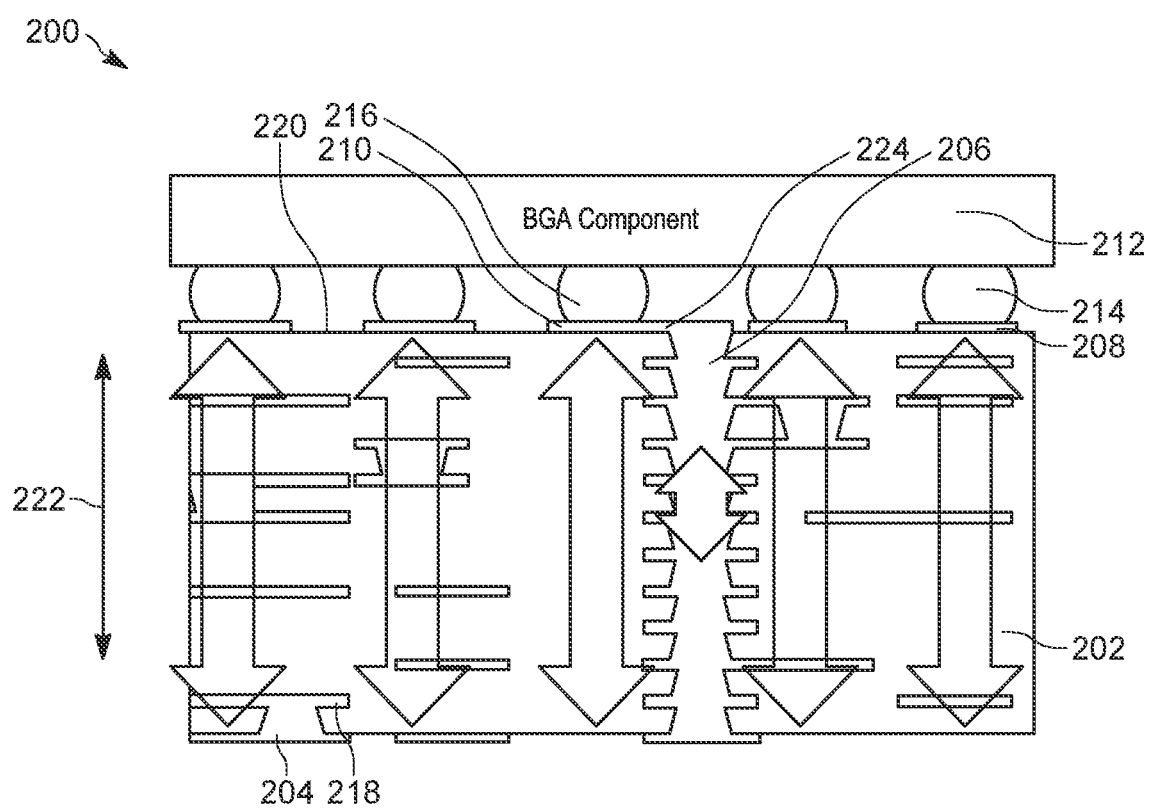
FIG. 2A is a cross-sectional view of a device with a substrate, vias, and contact pads to surface mount a BGA according to embodiments of the present disclosure.
Figure 3:
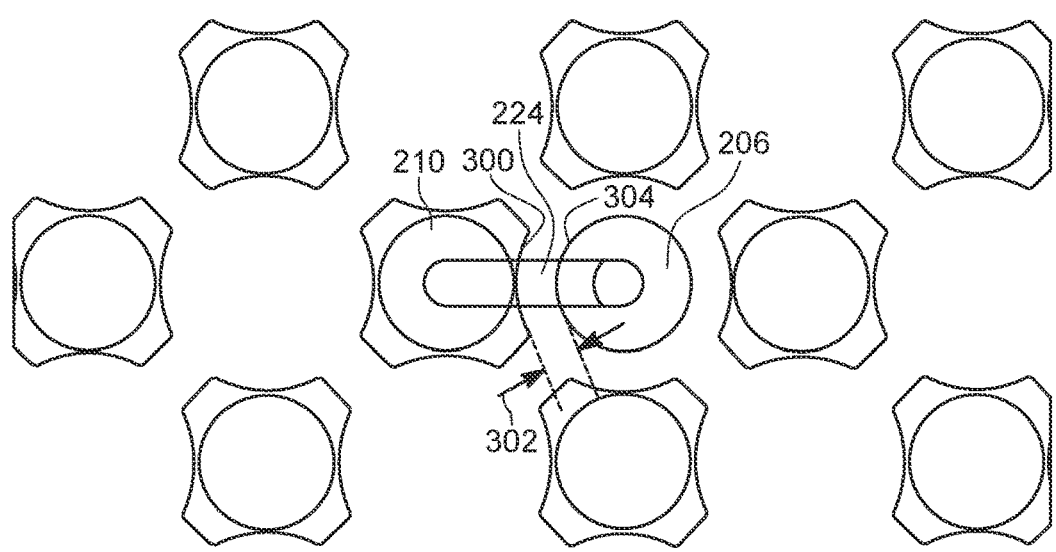
FIG. 3 is a plan view of the device of FIG. 2A.

FIGS. 2A and 3 show an example device 200 that solves the problem described above with respect to FIGS. 1A and 1B.

The device 200 includes a substrate 202, conductive vias 204, 206, and conductive pads 208, 210. Any suitable number of conductive vias 204, 206 and conductive pads 208, 210 may be used. The device 200 is to receive a BGA component 212 such as an IC or other electronic component with a BGA. The placement and quantity of conductive pads 208, 210 corresponds to a pattern of solder joints 214, 216 of the BGA.

The substrate 202 includes a dielectric material. The substrate 202 may be a circuit board, such as a multilayer circuit board. A multilayer circuit board may have any suitable number of layers, such as 2, 4, 8, 12, 16, or more. It is contemplated that thicker circuit boards or those with more layers have a greater susceptibility to the cracking/fracturing mode of failure addressed by the present disclosure. This is due to the greater thermal expansion of the substrate material with respect to the via material.

The dielectric material may include fiberglass with epoxy resin (often known as FR-4), phenolic paper (FR-2), various polymers, and similar electrically insulative materials.

The conductive vias 204, 206 extend into the substrate 202 to connect with trace connections 218 or components at different layers. In this example, a particular conductive via 206 extends to a surface 220 of the substrate to connect to a pad 210 that connects to a solder joint 216 of the BGA component 212. Any number of conductive vias 204, 206 may so exit from the surface 220 of the substrate 202. The conductive via 206 may be a stacked via or may be relatively long, and thereby may increase the difference in thermal expansion relative to the substrate 202 due to the replacement of substrate material with the less thermally expansive via material.

The conductive pads 208, 210 are positioned at the surface 220 of the substrate 202 and are aligned with the BGA connections, i.e., the solder joints 214, 216. A conductive pad 210 associated with the via 206 that extends to the surface 220 of the substrate 202 is offset from the via 206 in the plane of the surface 220.

The vias 204, 206, pads 208, 210, and other electrically conductive components may be made of copper, gold, or other metal or alloy that is a good electrical conductor.

The conductive material of the vias 204, 206 has a coefficient of thermal expansion that is different from the coefficient of thermal expansion of the dielectric material of the substrate 202. In various examples, the coefficient of thermal expansion of the via material is less than the coefficient of thermal expansion of the dielectric material.

The via 204, 206 may be aligned with an axis 222 perpendicular to the surface 220 of substrate. A first via 206 may have a first length of a conductive material aligned with the axis 222, and a second via 204 may have a second length of conductive material aligned with the axis 222. The first length of conductive material is greater than the second length of conductive material. Hence, thermal expansion of the device 200 in the vicinity of the first via 206 may be less than in the vicinity of the second via 204. When considering the length of less thermally expansive material in the direction of the axis 222, a total amount of such material may be considered, whether taking the form of a single via, a stacked via, or separate single or stacked vias that are above/below each other. A length of conductive material need not be continuous to significantly reduce thermal expansion.

The lateral offset of the conductive pad 210 with respect to the via 206 provides space for slight deformation to accommodate expansion of the substrate 202 with respect to the via 206. This deformation allows the solder joint 216 bonded to the via 206 to move slightly, instead of cracking or fracturing, to accommodate the difference in thermal expansion. Hence, the solder joint 216 associated with the via 206 is allowed to move due to thermal expansion consistently with the other solder joints 214 of the BGA component 212 and thereby does not crack or fracture.

A trace connection 224 may be provided at the surface 220 of the substrate 202 to connect the via 206 to the pad 210.

The BGA component 212 may have a predetermined arrangement of solder joints that cannot be readily modified. The BGA component 212 and its arrangement of solder joints may thus act as a constraint on the design of the circuit board. Hence, the device 200 may be subject to a predetermined arrangement of pads 208, 210. Offsetting a particular pad 210 to account for differential thermal expansion may not be possible given the predetermined arrangement of solder joints on the BGA component 212. Having a via 206 emerge at the surface 220 of the substrate 202 beside the respective pad 210 to which the via 206 is connected, instead of directly under the pad 210 as is normally done, may violate a minimum safe gap between the via 206 and other pads to which the via 206 is not connected. That is, the solder joint density of the BGA component 212 may require a pad density that does not permit vias to be positioned between pads to account for differential thermal expansion in the manner discussed above.

In fine-pitch BGAs, stacked vias may normally be placed under pads. Shifting vias away from the pads may result in insufficient metal-to-metal clearance, causing poor yields and short circuit defects. While reduced metal clearance may be resolved by reducing solder pad diameter, this also reduces reliability due to an increased risk of pad delamination during mechanical shock or stress.

Accordingly, as shown in FIG. 3, the conductive pad 210 may include a concave edge 300 that defines a gap 302 with a convex edge 304 of the offset via 206 to maintain adequate distance between the via 206 and the pad 210 given a constrained arrangement of pads. This reduces or eliminates the risk of short circuits or unintended electrical connections, which can reduce yield of products that include the device 100. In various examples, the concave edge 300 of the pad 210 and the convex edge 304 of the via 206 include complementary curvature that provide the gap 302 with a constant width. For example, the convex edge 304 of the via 206 may be circular or a complete circle, and the concave edge 300 of the pad 210 may be a circular segment that has a center coincident with the via 206.

Figure 2B:
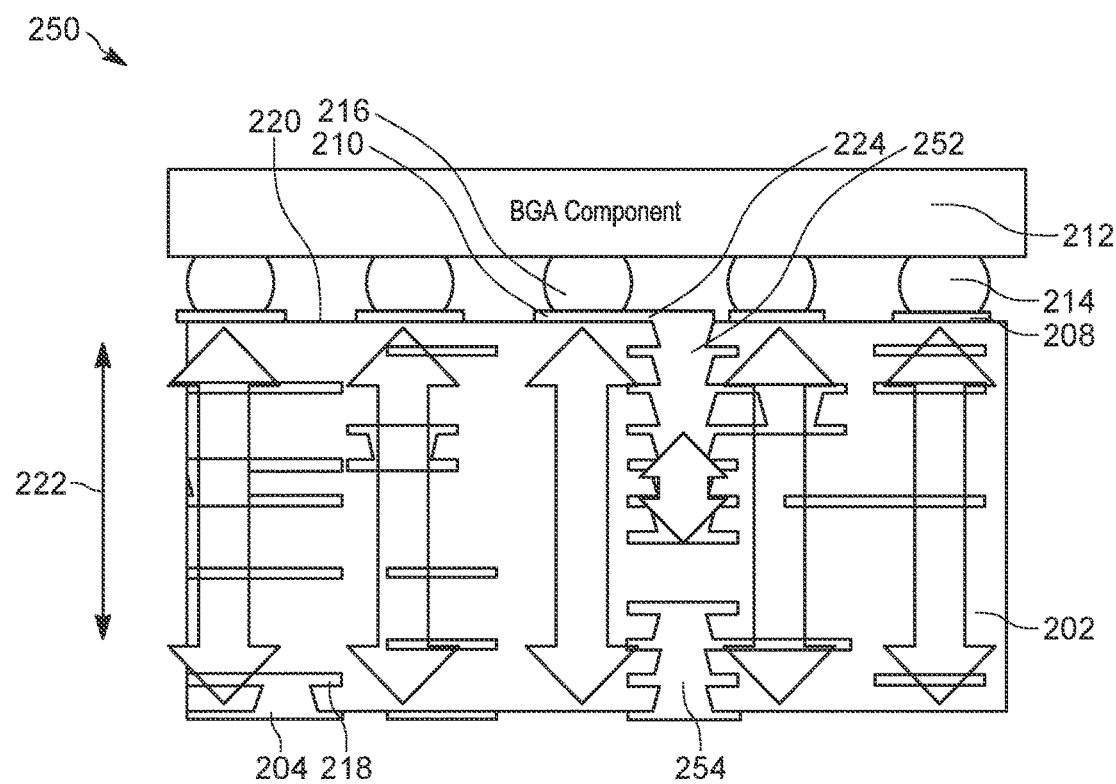
FIG. 2B is a cross-sectional view of another device with a substrate, vias, and contact pads to surface mount a BGA according to embodiments of the present disclosure.

FIG. 2B shows a device 250 that is similar to the device 200 of FIG. 2A, and only differences will be described in detail. The device 250 includes two stacked vias 252, 254 that are aligned along an axis 222 perpendicular to the surface 220 of the substrate 202. The stacked vias 252, 254 also cause a differential thermal expansion problem to a degree proportional to the total length of via material along the axis 222. Hence, a solder pad 210 may be offset from the stacked via 252 that emerges as the surface 220 of the substrate 202, as discussed with above with regard to FIG. 2A, to compensate for the differential thermal expansion.

Figure 4:
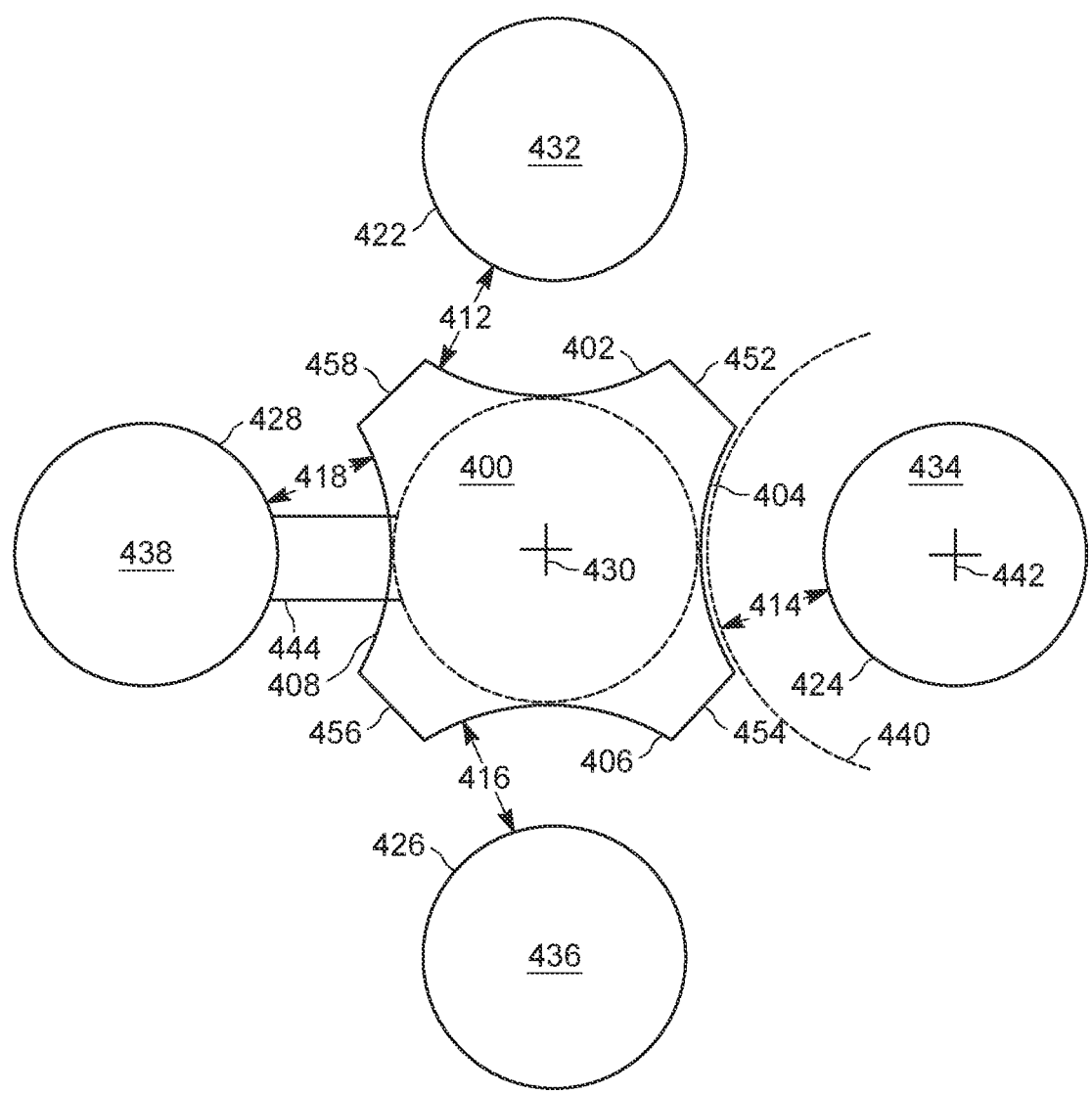
FIG. 4 is a plan view of a conductive pad with a concave edge according to embodiments of the present disclosure.

With reference to FIG. 4, an example shape of a conductive pad 400 is described. The conductive pad 400 may be used as any of the conductive pads discussed herein, such as the pad 210.

The conductive pad 400 includes a plurality of concave edges 402, 404, 406, 408 that each define a respective gap 412, 414, 416, 418 with a respective convex edge 422, 424, 426, 428 of any respective conductive vias 432, 434, 436, 438. The pad 400 may be positioned among any suitable number of adjacent vias 432, 434, 436, 438, such as zero, one, two, three, or four. The number of vias 432, 434, 436, 438 adjacent the pad 400 may be dictated by the design of the circuit board. The arrangement of vias 432, 434, 436, 438, and thus the orientation of the concave edges 402, 404, 406, 408, may also be governed by the design of the circuit board. The pad 400 may be provided with concave edges 402, 404, 406, 408 irrespective of the presence or absence of an adjacent via 432, 434, 436, 438. This may simplify the design of the pad, in that all pads may be of a substantially identical design.

In this example, the concave edges 402, 404, 406, 408 are radially evenly spaced about a periphery of the conductive pad 400 with respect to a center 430 of the pad 400. That is, each concave edge 402, 404, 406, 408 is offset from adjacent concave edges 402, 404, 406, 408 by 90 degrees to accommodate a rectangular grid arrangement of vias 432, 434, 436, 438.

In this example, the conductive pad includes a straight edge 452, 454, 456, 458 between two adjacent concave edges 402, 404, 406, 408. Each pair of adjacent concave edges 402, 404, 406, 408 has ends joined by a straight edge 452, 454, 456, 458.

The shape of the concave edges 402, 404, 406, 408 may be circular. Each concave edge 402, 404, 406, 408 may be a segment of a circle that remains outside a boundary or perimeter around a respective circular via 432, 434, 436, 438. FIG. 4 shows one such boundary 440 for the via 434. When the respective concave edge 404 of the pad 400 is kept outside the boundary 440, the pad 400 is sufficiently spaced apart, by gap 414, from the via 434 to avoid a short circuit or other defect. The via 434, boundary 440, and concave edge 404 of the pad 400 may share the same center 442. The same applies to the other concave edges 402, 406, 408.

Any via 438 that is to be electrically connected to the pad 400 may be so connected by a conductive trace connection 444 extending between the pad 400 and the via 438.

Figure 5:
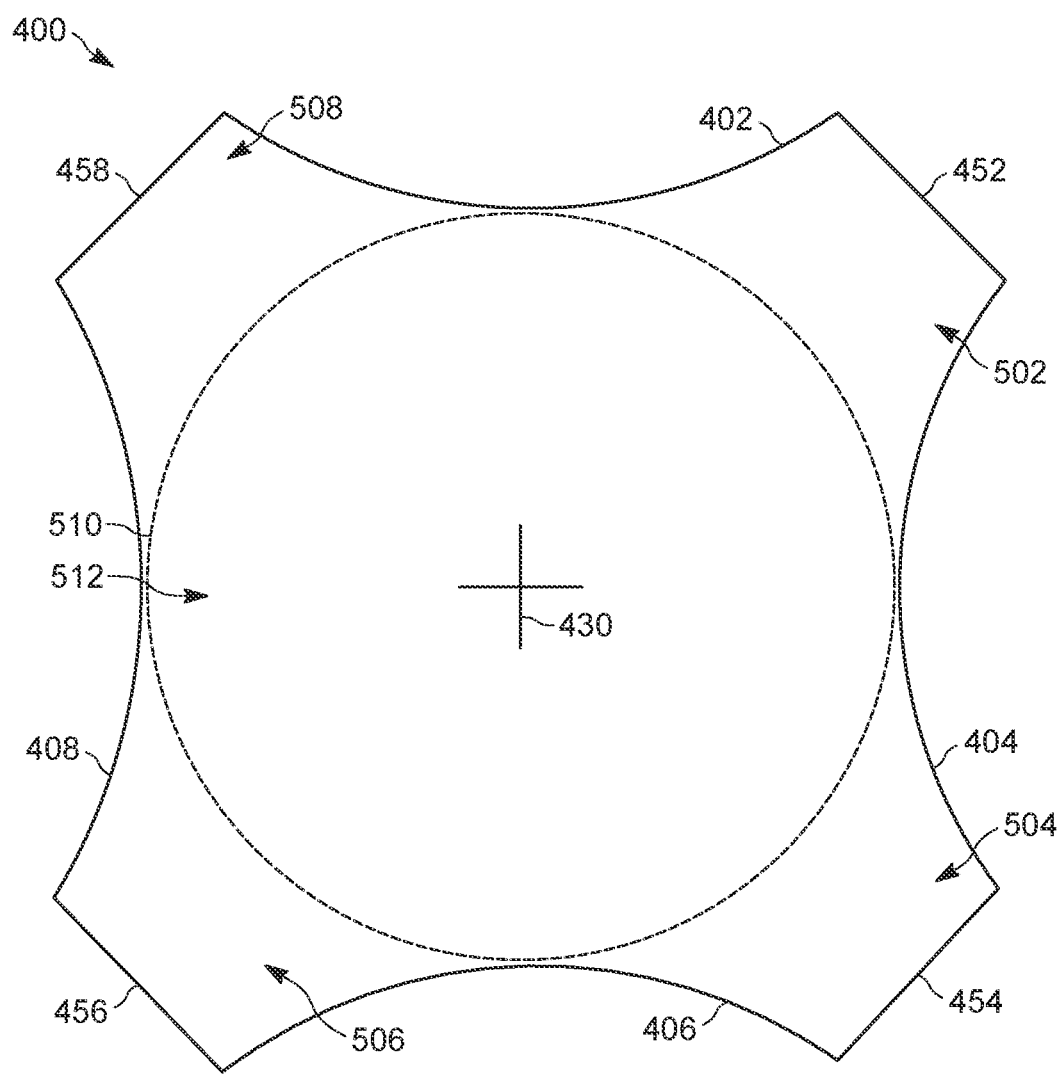
FIG. 5 is another plan view of the pad of FIG. 4.

As shown in FIG. 5, the conductive pad 400 may be considered to have lobes 502, 504, 506, 508 between the concave edges 402, 404, 406, 408. Adjacent pairs of lobes 502, 504, 506, 508 are separated by one of the concave edges 402, 404, 406, 408. Each lobe 502, 504, 506, 508 may extend outwards away from the bulk of the pad 400 to provide additional pad material to increase attachment strength of the pad to the substrate.

A solder-mask boundary 510 of the pad 400 may have a circular shape and size to allow bonding of a solder joint to a circular portion 512 of the pad 400. The lobes 502, 504, 506, 508 may extend inside the solder-mask boundary 510 and therefore be covered in solder mask material. As such, while the lobes 502, 504, 506, 508 may not bond to the solder joint, the lobes 502, 504, 506, 508 may provide integral strength to the pad 400 to attach the pad 400 to the substrate.

It should be understood that there are numerous shapes possible for conducive pads with one or more concave edges. FIGS. 6 to 9 show various examples.

Figure 6:
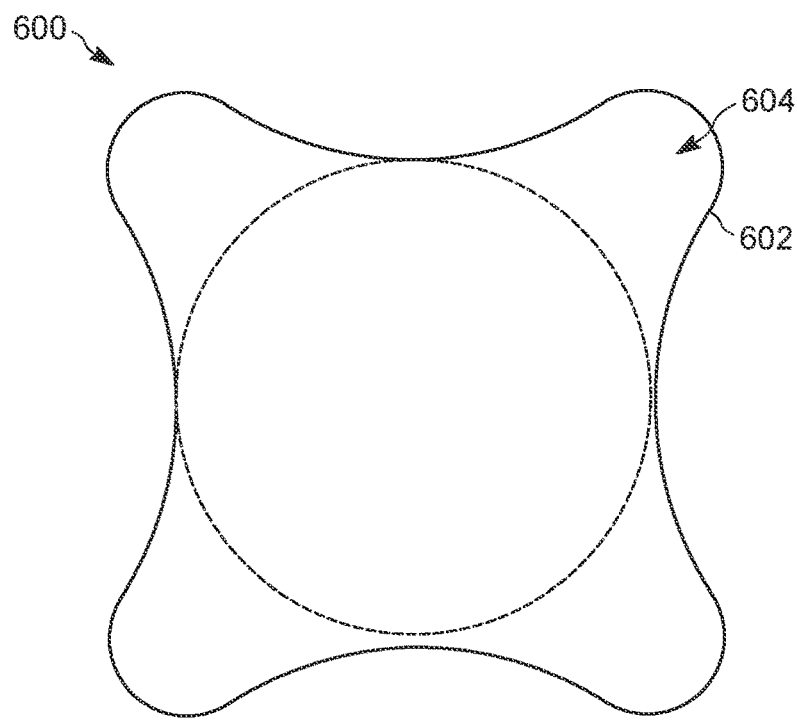
FIG. 6 is a plan view of another conductive pad with a concave edge according to embodiments of the present disclosure.

FIG. 6 shows a conductive pad 600 with four evenly space concave edges 602 and four convexly curved lobes 604, where each lobe 604 is positioned between two concave edges 602.

Figure 7:
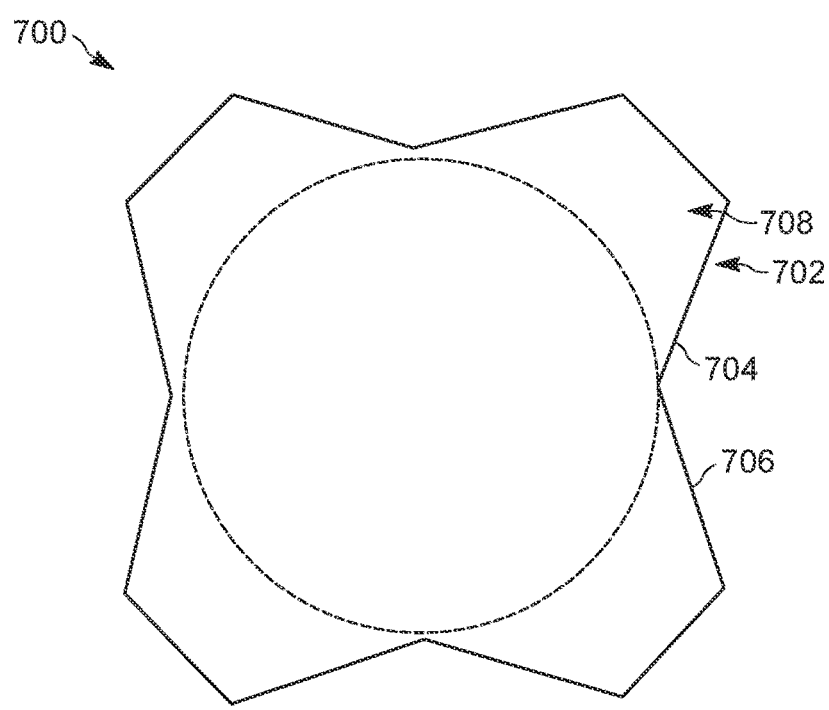
FIG. 7 is a plan view of another conductive pad with a concave edge according to embodiments of the present disclosure.

FIG. 7 shows a conductive pad 700 with four evenly spaced concave edges 702, each made up of two linear segments 704, 706. The linear segments 704, 706 approximate a concave curve. A minimum gap between the concave edge 702 and an adjacent via can be defined with respect to a nearest point on a linear segment 704, 706. The minimum gap may be established to avoid a short circuit or other defect. The pad 700 includes a lobe 708 between pairs of concave edges 702. The lobe 708 may be defined by line segments as well.

Figure 8:
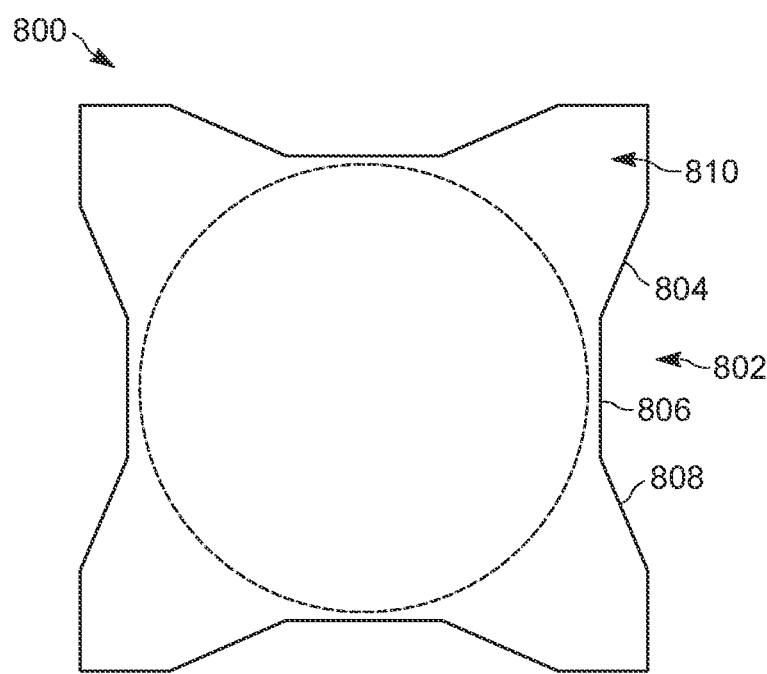
FIG. 8 is a plan view of another conductive pad with a concave edge according to embodiments of the present disclosure.

FIG. 8 shows a conductive pad 800 with four evenly spaced concave edges 802, each made up of three linear segments 804, 806, 808 that approximate a concave curve. A minimum gap between the concave edge 802 and an adjacent via can be defined with respect to a nearest point on a linear segment 804, 806, 808 to avoid a short circuit or other defect. The pad 800 includes a lobe 810 defined by line segments between pairs of concave edges 802.

Figure 9:
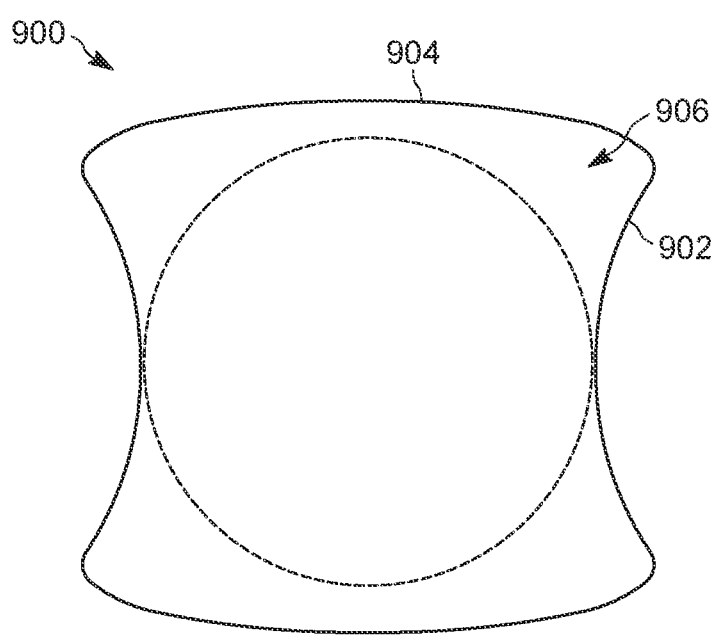
FIG. 9 is a plan view of another conductive pad with a concave edge according to embodiments of the present disclosure.

FIG. 9 shows a conductive pad 900 with concave edges 902 and convex edges 904. A concave edge 902 may be positioned to accommodate a via. Where clearance is not required, a convex edge 904 may be provided. The conductive pad 900 may have lobes 906 between edges 902, 904.

Figure 10:
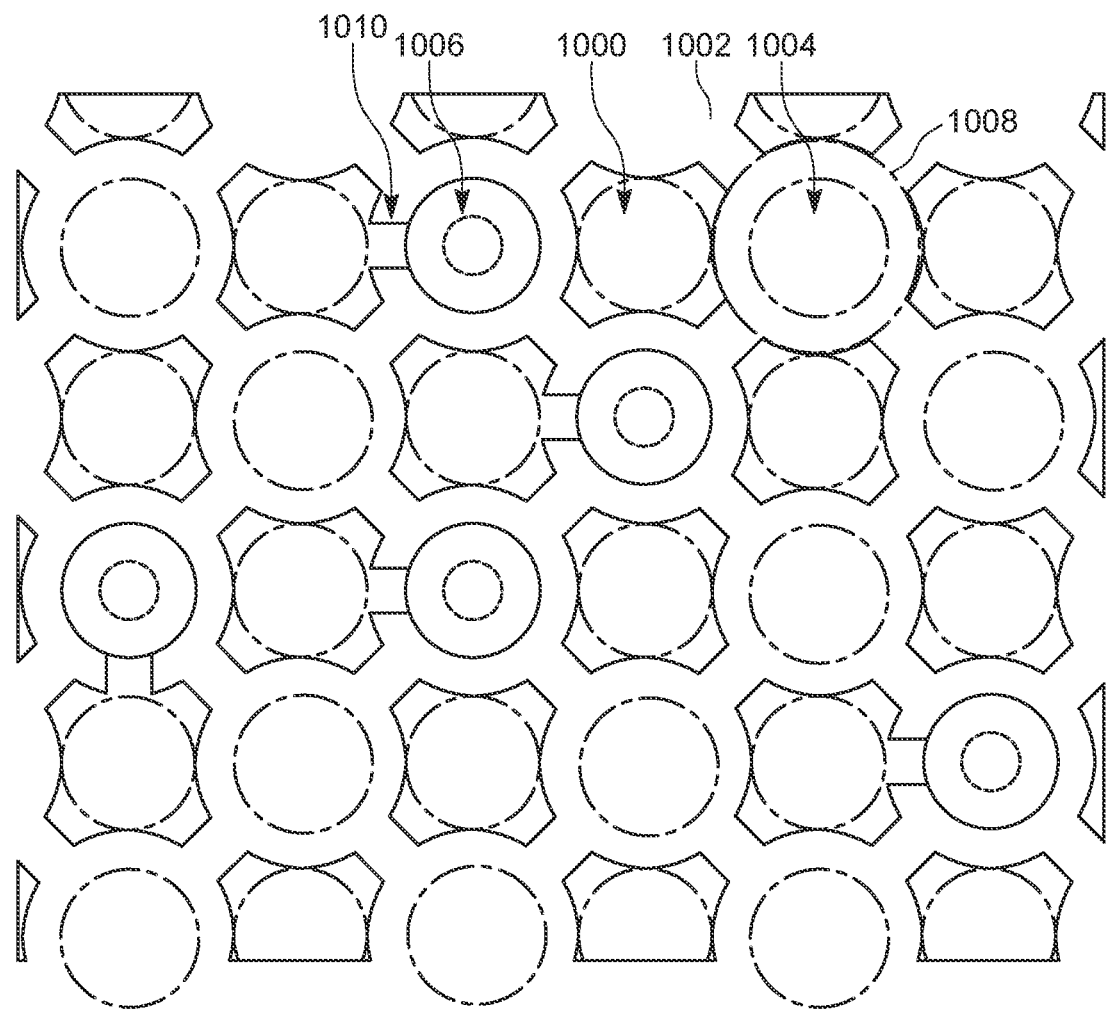
FIG. 10 is a plan view of an arrangement of conductive pads with concave edges according to embodiments of the present disclosure Skilled artisans will appreciate that elements in the figures are illustrated for simplicity and clarity and have not necessarily been drawn to scale. For example, the dimensions of some of the elements in the figures may be exaggerated relative to other elements to help improve understanding of embodiments of the present disclosure.

FIG. 10 shows an example array of conductive solder pads 1000 to receive connection of a BGA using the techniques discussed herein. The array may be a portion of a larger arrangement to receive a BGA component. The array may be rectangular with each row staggered with respect to adjacent rows.

The pads 1000 are disposed on a surface of a substrate 1002 of a circuit board, such as a multilayer circuit board. The pads 1000 may have the same shape, such as any of the concave-edged shapes discussed herein.

An array of candidate via locations 1004 may be arranged at the surface of the substrate 1002 interstitially among to the array of solder pads 1000. Each candidate via location 1004 may or may not have a via 1006 that emerges at the surface of the substrate 1002.

Each candidate via location 1004 includes a boundary 1008 to space a via 1006 disposed at the candidate via location 1004 apart from any solder pads of the array of solder pads 1000 adjacent the candidate via location 1004. The boundary 1008 is larger than the outer perimeter of the via 1006 and thereby provides a gap around the via 1006.

One or more solder pads 1000 has a concave shape to accommodate the boundary 1008 to provide sufficient space between the a via 1006 and the solder pad 1000 to avoid inadvertent electrical connection. That is, the material of the solder pad 1000 does not extend into the boundaries 1008 around the via candidate via locations 1004 that surround the solder pad 1000.

The boundary 1008 may be circular and the concave shape of the solder pads 1000 may be correspondingly circular with lobes.

To provide desired electrical connections, an array of trace connections 1010 may be disposed on the surface of the substrate 1002. Each trace connection 1010 connects a solder pad 1000 to a respective via 1006.

As such, potential via locations 1004 may be systematically offset from solder pads 1000 with a boundary 1008 that reduces risk of undesired electrical connections, in a manner that reduces risk of a stacked via from causing differential thermal expansion that cracks or fractures a solder joint of a BGA.

A test was conducted with Table 1 showing results obtained. A test panel with FR-4 laminate was constructed and heated to reflow solder joints. The test panel was provided with various stacked via designs (#1 to #4) using both conventional techniques (labeled "in pad" in Table 1) and the techniques discussed herein (labeled "offset (invention)" in Table 1) to connect the vias with the solder pads.

TABLE 1

Total Reflow Crack Area Normalized to Number of Solder Joints

| Via Design and Pad Connection | Normalized Crack Area |
| --- | --- |
| Via stack design #1 in pad | 4.3 |
| Via stack design #1 offset (invention) | 0 |
| Via stack design #2 in pad | 1.7 |
| Via stack design #2 offset (invention) | 0 |
| Via stack design #3 in pad | 4.3 |
| Via stack design #3 offset (invention) | 0 |
| Via stack design #4 in pad | 0.6 |
| Via stack design #4 offset (invention) | 0 |

As can be seen, the techniques discussed herein resulted in no cracked solder joints, whereas conventional techniques resulted in various degrees of cracking dependent on via design.

In view of the above, it should be apparent that solder pads with concave edges allow for positioning of vias as laterally offset from the solder pads to compensate for differential thermal expansion of circuit-board substrate and via materials and to accommodate predetermined BGAs, including fine-pitch BGAs. Solder joint cracking or fracturing due to thermal conditions, which may be particularly acute with stacked vias, may be reduced or avoided without requiring changes to the BGA.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "one of", without a more limiting modifier such as "only one of", and when applied herein to two or more subsequently defined options such as "one of A and B" should be construed to mean an existence of any one of the options in the list alone (e.g., A alone or B alone) or any combination of two or more of the options in the list (e.g., A and B together).

A device or structure that is "configured" in a certain way is configured in at least that way, but may also be configured in ways that are not listed.

The terms "coupled", "coupling" or "connected" as used herein can have several different meanings depending on the context in which these terms are used. For example, the terms coupled, coupling, or connected can have a mechanical or electrical connotation. For example, as used herein, the terms coupled, coupling, or connected can indicate that two elements or devices are directly connected to one another or connected to one another through intermediate elements or devices via an electrical element, electrical signal or a mechanical element depending on the particular context.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A device comprising:
a substrate including dielectric material;
a conductive via extending into the substrate from a surface of the substrate; and
a conductive pad positioned at the surface of the substrate and offset in a plane of the surface from the conductive via, the conductive pad to receive a solder joint connection to an electronic component;

wherein the conductive pad includes a circularly concave edge that defines a gap with a circularly convex edge of the conductive via, wherein the circularly concave edge of the conductive pad and the circularly convex edge of the conductive via comprise respective circular segments that share a same circular center, wherein the circularly concave edge of the conductive pad and the circularly convex edge of the conductive via include complementary circular curvature that provide the gap with a constant width along an entirety of the circularly concave edge.

2. The device of claim 1, wherein the conductive pad includes a plurality of circularly concave edges that each define a respective gap with a circularly convex edge of a respective conductive via.

3. The device of claim 2, wherein the plurality of circularly concave edges are radially evenly spaced with respect to a center of the conductive pad.

4. The device of claim 1, wherein the conductive pad includes a plurality of lobes and a plurality of circularly concave edges, wherein adjacent pairs of lobes are separated by one of the circularly plurality of concave edges.

5. The device of claim 1:
wherein the conductive via is a first conductive via that is aligned with an axis perpendicular to the surface of the substrate with a first length of a conductive material;
the device further comprising a second conductive via that is aligned with the axis perpendicular to the surface of the substrate with a second length of a conductive material;
wherein the conductive material has a coefficient of thermal expansion that is different than a coefficient of thermal expansion of the dielectric material of the substrate;
wherein the first length of the conductive material is greater than the second length of the conductive material.

6. The device of claim 1, wherein the conductive pad includes a circular portion and lobes extending from the circular portion that define the circularly concave edge, a respective center of the circular portion of the conductive pad is to receive the solder joint connection.

7. The device of claim 1, wherein the conductive pad is offset from the conductive via to form a circular boundary, the circular boundary being formed to minimize or reduce electrical connections associated with differential thermal expansion between the conductive via and the dielectric material, to prevent cracking or fractures of the solder joint of a ball grid array received at the conductive pad.

8. A device comprising:
a multilayer circuit board;
a plurality of solder pads positioned at a surface of the multilayer circuit board to receive solder joint connections to an electronic component;
a stacked via in the multilayer circuit board and exiting the multilayer circuit board at the surface at a position adjacent at least two solder pads of the plurality of solder pads; and
a trace connection at the surface of the multilayer circuit board connecting the stacked via to a first solder pad of the at least two solder pads;
wherein a second solder pad of the at least two solder pads includes a circularly concave edge that provides a gap with respect to a circularly convex edge of the stacked via,
wherein the circularly concave edge of the second solder pad and the circularly convex edge of the stacked via comprise respective circular segments that share a same circular center, wherein the circularly concave edge of the second solder pad and the circularly convex edge of the stacked via include complementary circular curvature that provide the gap with a constant width along an entirety of the circularly concave edge.

9. The device of claim 8, wherein the first solder pad includes another circularly concave edge that provides another gap with respect to the circularly convex edge of the stacked via.

10. The device of claim 8, wherein the second solder pad includes a plurality of circularly concave edges.

11. The device of claim 10, wherein the plurality of circularly concave edges are evenly spaced about the periphery of the second solder pad.

12. The device of claim 10, wherein the second solder pad includes a straight edge between two adjacent circularly concave edges of the plurality of circularly concave edges.

13. The device of claim 8, wherein the second solder pad includes a plurality of lobes and a plurality of circularly concave edges, wherein adjacent pairs of lobes are separated by one of the plurality of circularly concave edges.

14. The device of claim 8, further comprising:
an array of solder pads that includes the at least two solder pads; and
an array of candidate via locations arranged interstitially among to the array of solder pads;
wherein each solder pad of the array of solder pads includes a circularly concave edge next to each respective adjacent candidate via location to provide a gap between the solder pad and the respective adjacent candidate via location.

15. The device of claim 8, wherein the first solder pad of the at least two solder pads includes a respective circularly concave edge that provides a respective gap with respect to the circularly convex edge of the stacked via,
wherein the respective circularly concave edge of the first solder pad and the circularly convex edge of the stacked via comprise further respective circular segments that share a respective same circular center, wherein the respective circularly concave edge of the first solder pad and the circularly convex edge of the stacked via include respective complementary circular curvature that provide the respective gap with a respective constant width along a respective entirety of the respective circularly concave edge, and
wherein the at least two solder pads include respective circular portions and respective lobes extending from the respective circular portions that define respective circularly concave edges, respective centers of the respective circular portions of the at least two solder pads are to receive respective solder joint connections.

16. The device of claim 8, wherein the solder pads are offset from the stacked via to form respective circular boundaries, the respective circular boundaries formed to minimize or reduce electrical connections associated with differential thermal expansion between the stacked via and a dielectric material of the multilayer circuit board, to prevent cracking or fractures of the solder joint connections to a ball grid array received at the solder pads.

17. A device comprising:
a substrate;
an array of solder pads on a surface of the substrate to receive a ball grid array of an electronic component to be mounted to the substrate; and
an array of candidate via locations arranged interstitially among the array of solder pads;

wherein each candidate via location of the array of candidate via locations includes a circular boundary to space a circularly shaped via disposed at the candidate via location apart from any solder pads of the array of solder pads adjacent the candidate via location;

wherein a solder pad of the array of solder pads includes a circularly concave shape to accommodate the circular boundary of any adjacent candidate via location, wherein the circularly concave shape of the solder pad, the circular boundary of an adjacent candidate via location comprises respective circular segments that share a common circular center, and wherein the circularly concave shape of the solder pad and the circularly shaped via include complementary circular curvature that provide a gap with a constant width therebetween along an entirety of the circularly concave shape of the solder pad.

18. The device of claim 17, further comprising an array of traces on the surface of the substrate, wherein each trace of the array of traces connects a respective solder pad of the array of solder pads to a respective via positioned at a respective candidate via location of the array of candidate via locations.

19. The device of claim 17, wherein the solder pad includes a circular portion and lobes extending from the circular portion that define the circularly concave shape, a respective center of the circular portion of the solder pad to receive a ball of the ball grid array.

20. The device of claim 17, wherein the solder pads are offset from the candidate via locations to form respective circular boundaries, the respective circular boundaries formed to minimize or reduce electrical connections associated with differential thermal expansion between stacked vias at the candidate via locations and a dielectric material of the substrate, to prevent cracking or fractures of solder joint connections to the ball grid array received at the solder pads.

* * * * *